(12) United States Patent
Rickes et al.

(10) Patent No.: US 6,735,106 B2
(45) Date of Patent: May 11, 2004

(54) ACCELERATED FATIGUE TESTING

(75) Inventors: Juergen T. Rickes, Cupertino, CA (US); Hugh P. McAdams, McKinney, TX (US); James W. Grace, Los Altos Hills, CA (US); John Y. Fong, Sunnyvale, CA (US); Ralph H. Lanham, Cupertino, CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 1 day.

(21) Appl. No.: 10/190,102

(22) Filed: Jul. 2, 2002

(65) Prior Publication Data

US 2004/0004854 A1 Jan. 8, 2004

(51) Int. Cl.[7] .............................................. G11C 11/22
(52) U.S. Cl. .................. 365/145; 365/149; 365/189.04; 365/201
(58) Field of Search ................................ 365/145, 149, 365/189.04, 189.05, 201, 185.12, 230.03

(56) References Cited

U.S. PATENT DOCUMENTS

| 5,373,463 | A | * | 12/1994 | Jones, Jr. ..................... 365/145 |
| 5,949,731 | A | * | 9/1999 | Tsukude ................ 365/230.01 |
| 6,038,162 | A | * | 3/2000 | Takata et al. ................ 365/145 |
| 6,314,018 | B1 | * | 11/2001 | Pochmuller ................. 365/149 |

* cited by examiner

Primary Examiner—Gene Auduong

(57) ABSTRACT

A memory such as a FeRAM implements accelerated fatigue operations that simultaneously change the storage state of large numbers of memory cells and can be rapidly repeated. In one embodiment, the FeRAM includes multiple segments with plate lines in each segment being isolated from plate lines in other segments. A first fatigue operation uses standard read/write decoding for word lines but simultaneously activates all segments. A second fatigue operation activates all segments and all plate lines and exercises one row of memory cells in each plate line group. A third fatigue operation is similar to the second but cycles through rows in the plate line groups so that a number of repetitions of the third fatigue operation equally fatigue every FeRAM cell.

19 Claims, 5 Drawing Sheets

ACCELERATED FATIGUE TESTING

BACKGROUND

Integrated circuit manufacturers often test integrated circuits and attempt to identify chips having latent defects that may lead to unacceptably short useful lifetimes. One example of an integrated circuit requiring such testing is a ferroelectric random access memory (FeRAM). A FeRAM generally includes an array of memory cells where each memory cell contains at least one ferroelectric capacitor. Each ferroelectric capacitor contains a ferroelectric material sandwiched between conductive plates. To store a data bit in a FeRAM cell, a write operation applies write voltages to the plates of the ferroelectric capacitor in the FeRAM cell to polarize the ferroelectric material in a direction associated with the data bit being written. A persistent polarization remains in the ferroelectric material after the write voltages are removed and thus provides non-volatile storage of the stored data bit.

A conventional read operation for a FeRAM determines the data bit stored in a FeRAM cell by connecting one plate of a ferroelectric capacitor to a bit line and raising the other plate to a read voltage. If the persistent polarization in the ferroelectric capacitor is in a direction corresponding to the read voltage, the read voltage causes a relatively small current through the ferroelectric capacitor, resulting in a small charge and voltage change on the bit line. If the persistent polarization initially opposes the read voltage, the read voltage flips the direction of the persistent polarization, discharging the plates and resulting in a relatively large charge and voltage increase on the bit line. A sense amplifier can determine the stored value from the resulting bit line current or voltage.

Repeated reading and writing of a FeRAM cell, which changes the polarization state of the ferroelectric capacitor, can fatigue the ferroelectric material and change the properties of the FeRAM cell. The resulting fatigue may eventually lead to a failure. One way to predict when a particular FeRAM cell may fail is to measure the properties on the FeRAM cell before and after performing a series of read and write operations on the FeRAM cell. A measured change in the properties of the FeRAM cell can then be extrapolated to the desired minimum life of the FeRAM cell to project whether the FeRAM cell will still be operable. If the extrapolation indicates that the FeRAM cell will fail before reaching the desired minimum life, the FeRAM cell may have a latent defect and may be replaced with redundant FeRAM cells in a memory device.

The minimum number of read or write cycles before a failure of a FeRAM cell must be large (e.g., on the order of $10^{15}$ cycles or more) to provide a memory device with a commercially viable life. The large number of cycles before failure can make fatigue testing very time consuming. Extrapolation to $10^{15}$ read/write cycles, for example, might reasonably require a test to actually perform $10^{12}$ read/write cycles on a FeRAM cell. However, performing $10^{12}$ read and write operations on every memory cell in a reasonable size FeRAM (e.g., in a 4-megabit FeRAM) would literally require days, making such testing impractical for production testing of FeRAM and at least bothersome when testing a FeRAM design. Extrapolation can be based on a smaller number of read and write cycles per FeRAM cell to reduce the testing time, but reduction of the number of cycles reduces the accuracy of the test.

U.S. Pat. No. 6,314,018 describes a FeRAM having a test mode of operation that can speed up fatigue testing. This FeRAM uses a specific FeRAM architecture capable of pulsing two plate segments simultaneously in the test mode and a single plate segment in a normal mode. The test mode thus simultaneously accesses a larger number of FeRAM cells than can read or write operations in the normal mode.

In view of the need for accurate testing in order to provide reliable FeRAM, improved architectures and processes that permit fatigue testing within commercially expedient times are sought.

SUMMARY

In accordance with an aspect of the invention, a FeRAM has an architecture implementing a set of test modes that accelerate fatigue testing. One test mode uses decoding for standard read/write operations in each section of the FeRAM but simultaneously exercises all sections. Another test mode simultaneously exercises one row per plate-line group for all plate-line groups and all segments. The same row can be repeatedly exercised to heavily fatigue (e.g., $10^{14}$ cycles) a portion of the FeRAM, or the rows of the plate line groups can be sequentially exercised to fatigue test a larger number of FeRAM cells.

One specific embodiment of the invention is an integrated memory such as a FeRAM. The memory includes: multiple segments, where each segment contains bit lines and memory cells connected to the bit lines. An address decoding circuit for the memory has a first mode for read and write operations, and in the first mode, the address decoding circuit selects one of the segments and makes the memory cells in the selected segment accessible. The address decoding circuit has a second mode for accelerated fatigue operations, and in the second mode, the address decoding circuit selects all of the segments so that memory cells in all of the segments are simultaneously accessible for a change in state. In the first mode, the address decoding circuit generally makes only the bit lines in the selected segment accessible, but in the second mode, the address decoding circuit activates drive circuits for all of the bit lines.

For a FeRAM, each memory cell generally includes a select transistor and a ferroelectric storage capacitor, and each of the segments includes plate lines that are connected to respective subsets of the memory cells. The select transistor in a memory cell connects one plate of the storage capacitor to a corresponding bit line, and each plate line connects to the other plate of each storage capacitor in the memory cells corresponding to the plate line. In the second mode, the address decoding circuit either activates only one of the plate lines in each segment or alternatively activates all of the plate lines. Activating all of the plate lines allows simultaneously changing the states of more FeRAM cells, but generally requires more bit line current to flip the polarization state of multiple FeRAM cells coupled to each bit line.

Another embodiment of the invention is a FeRAM including one or more memory sections, a first address decoding circuit, and a second address decoding circuit. Each memory section includes memory cells, bit lines, and word lines. The memory cells are arranged in rows and columns with each row of memory cells being connected to a corresponding one of the word lines and each column of memory cells being connected to a corresponding one of the bit lines. Each memory section is further divided into segments with each segment including the bit lines and the memory cells in a set of the columns. Each segment further includes plate lines and drive circuits with the drive circuits being respectively connected to the plate lines in the segment. The first address decoding circuit generates segment select signals, and the second address decoding circuit generates plate line select signals. Each plate line drive circuit drives the connected plate line in response to activation of both the segment select signal corresponding to the segment containing the drive circuit and the corresponding plate line select signal.

Test modes of the first and second decoding circuits implement accelerated fatigue operations. In particular, the first address decoding circuit can have a normal mode in which the first address decoding circuit activates only one of the segment select signals and a test mode in which the first address decoding circuit simultaneously activates all of the segment select signals. Similarly, the second address decoding circuit can have a normal mode in which the second address decoding circuit activates only one of the plate line select signals and a test mode in which the second address decoding circuit simultaneously activates all of the plate line select signals. For normal read and write operations, the first and second address decoding circuits to operate in their respective normal modes. For one accelerated fatigue operation, the first address decoding circuits operates in its test mode and the second address decoding circuit operates in its normal mode, and another accelerated fatigue operation operates the first and second address decoding circuits in their respective test modes.

When the memory contains multiple sections, a third address decoding circuit can generate a plurality of section select signals. The third address decoding circuit has a normal mode in which the third address decoding circuit activates only one of the section select signals and a test mode in which the third address decoding circuit simultaneously activates all section select signals.

Yet another embodiment of the invention is an accelerated fatigue operation that includes: (a) activating one or more word lines to select FeRAM cells in a FeRAM array; (b) activating one or more plate lines that correspond to the activated word lines; and (c) simultaneously activating all bit lines in the FeRAM array, wherein activated levels of the plate lines and the bit lines flip polarizations states in the selected FeRAM cells. Steps (b) and (c) are generally repeated a large number of times (e.g., $10^{12}$–$10^{14}$ times) to fatigue the selected FeRAM cells. The activated levels of the plate lines and the bit lines generally change for each repetition as required to flip the state of a FeRAM cell. The FeRAM cells selected in step (a) can be maintained for all repetitions of steps (b) and (c), or repetitions of step (a) can cycle the selected word line addresses through a range identifying the FeRAM cells being fatigued.

When step (a) simultaneously activates multiple word lines, the word lines are generally selected to correspond to different plate lines in the FeRAM array to avoid the requirement of large plate line drive circuits. Step (b) generally causes the plate line drive circuits to simultaneously drive all plate lines that correspond to the activated word lines, and step (b) may cause simultaneous driving all of the plate lines in the FeRAM array to simultaneously cycle a larger number of FeRAM cells.

BRIEF DESCRIPTION OF THE DRAWINGS

Use of the same reference symbols in different figures indicates similar or identical items.

DETAILED DESCRIPTION

Figure 1:
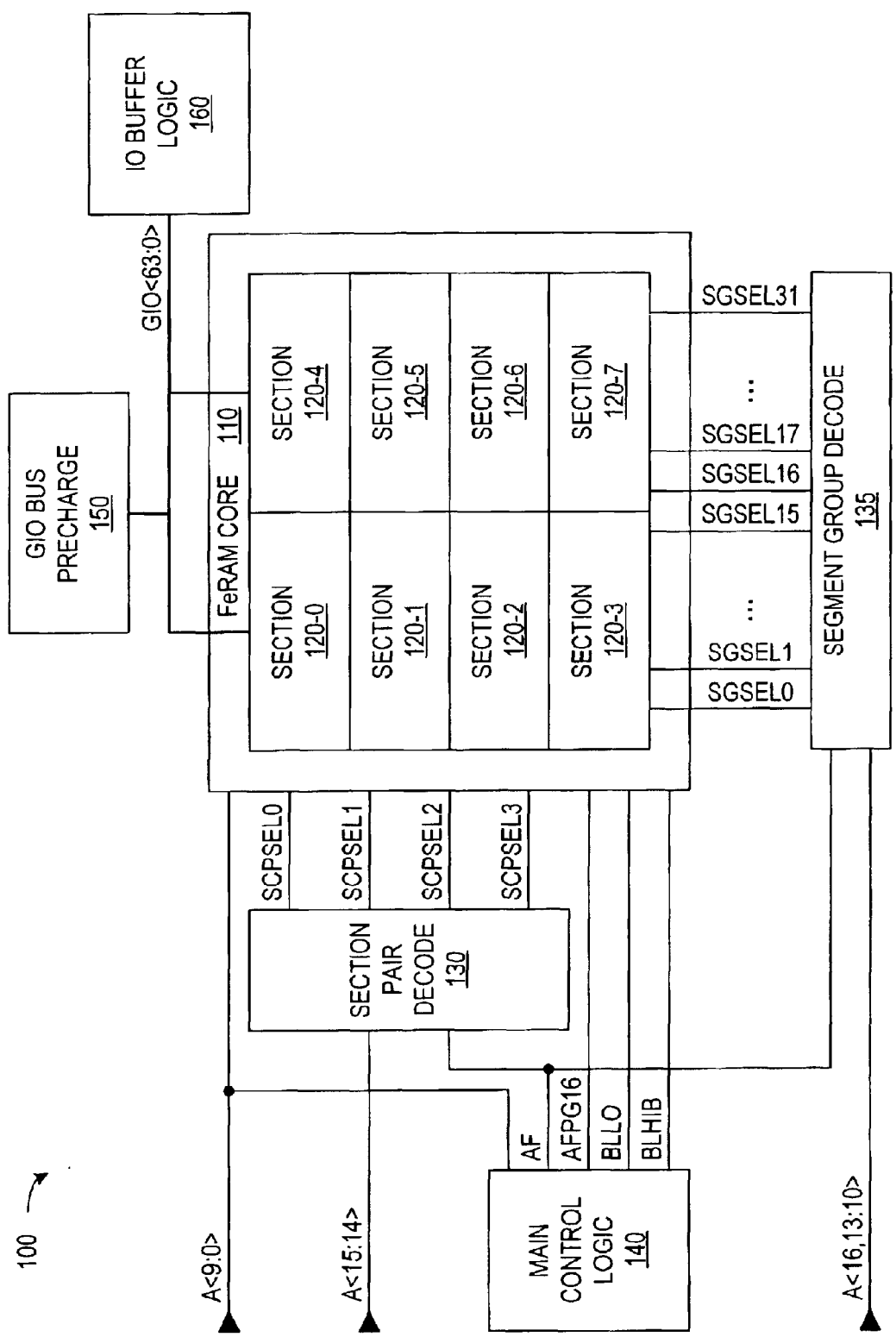
FIG. 1 is a block diagram of a FeRAM in accordance with an embodiment of the invention.

In accordance with an embodiment of the invention, a FeRAM has an array architecture and decoding circuits that implement test modes for accelerated fatigue testing operations. FIG. 1 is a block diagram of a FeRAM 100 in accordance with an embodiment of the invention. FeRAM 100 includes a FeRAM core 110, decoding circuits 130 and 135, main control logic 140, a precharge circuit 150, and I/O buffers 160. FeRAM core 110 contains FeRAM cells for storage of data, and decoding circuits 130 and 135 decode or interpret an address signal for read, write, and accelerated fatigue operations accessing specific FeRAM cells in FeRAM core 110. Main control logic 140 controls operation of FeRAM 100 including the read operations, write operations, and accelerated fatigue operations. Precharge circuit 150 and I/O buffers 160 work in cooperation to input data signals for writing to FeRAM core 110 and to output data signals read from FeRAM core 110.

In illustrated embodiment of FIG. 1, FeRAM core 110, which contains FeRAM cells, is divided into eight sections 120-0 to 120-7 for address decoding and data access. Sections 120-0 to 120-7 more specifically form a 2×4 array, and each pair of sections (120-0, 120-4), (120-1, 120-5), (120-2, 120-6), or (120-3, 120-7) contains 1 megabit of data storage, making FeRAM 100 a 4-megabit device. The size, arrangement, and number of sections in FeRAM 100 are merely examples to provide a definite illustration of an embodiment of the invention. As will be understood, the 4-Mbit configuration described herein can be reduced or expanded in size and altered in arrangement without departing from the spirit of the invention.

For an access to a FeRAM cell in FeRAM core 110, section pair decoder 130 decodes two address bits and activates one of the four select signals SCPSEL0, SCPSEL1, SCPSEL2, and SCPSEL3 to select a horizontally adjacent pair of sections (120-0, 120-4), (120-1, 120-5), (120-2, 120-6), or (120-3, 120-7) containing the memory cells selected for access. Each section 120-0 to 120-7 contains 16 segments, and segment group decoder 135 decodes five address bits to activate one of segment select signals SGSEL0 to SGSEL31, thereby selecting one segment from the selected pair of sections.

Figure 2:
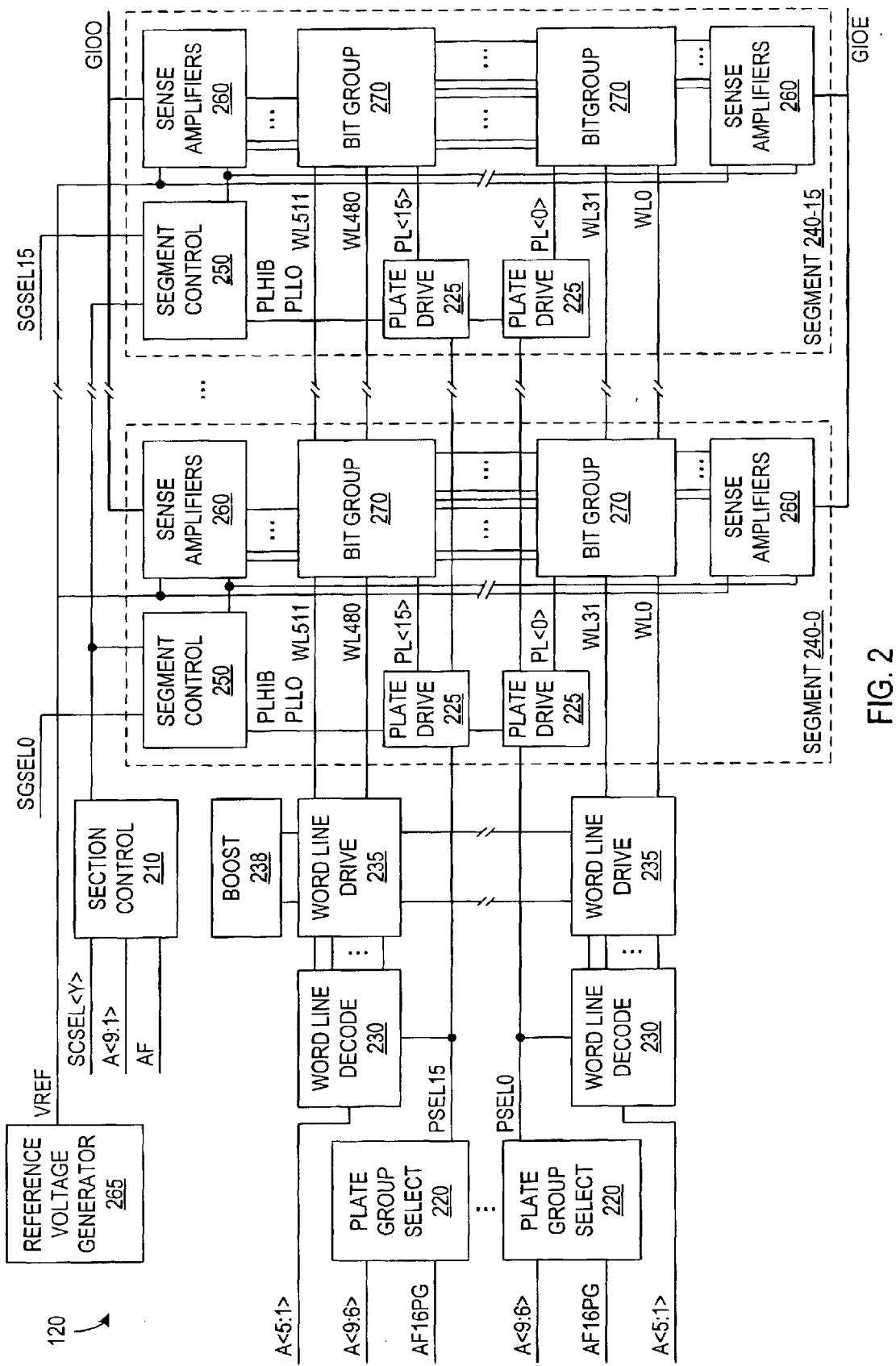
FIG. 2 is a block diagram of a section of the FeRAM of FIG. 1.

FIG. 2 is a block diagram of an exemplary embodiment of a section 120 of memory core 110 of FIG. 1. In the exemplary embodiment, each section 120 includes 512 word lines WL0 to WL511, which are continuous across the 16 segments in the section 120. Each section 120 of memory core 110 further includes section control logic 210, plate group select logic 220, word line decode and drive circuits 230 and 235, and sixteen segments 240-0 to 240-15. Each segment 240 includes sixty-four bit lines, segment control logic 250, sixty-four sense amplifiers 260, and sixteen bit groups 270. Each bit group 270 includes a set of FeRAM cells that have a common plate line, and associated plate drive circuits 225 control plate line voltages PL<0:15> of the respective bit groups 270.

A normal read or write operation in FeRAM 100 accesses 64 FeRAM cells at a time. FeRAM cell selection for a normal access includes activating a selected one of word lines WL0 to WL511, connecting a selected segment 240 to the global I/O bus, and simultaneously activating only the plate line that is in the selected segment 240 and corresponds to the selected word line. Word line activation includes section pair decoder 130 activating one of section pair select signals SCPSEL0 to SCPSEL3 to select a pair of sections 120. Plate group select logic 220 in the selected sections 120 determines from address signals A<9:6> which bit groups 270 correspond to the row address of the selected memory cells, and the word line decoder 230 activated by plate group select logic 220 decodes address signals A<5:1> to cause the associated word line drive circuit 235 to activate the selected word line. Only the plate line drive circuit 225 that both plate group select logic 220 and segment group decoder 135 select activates its corresponding plate line.

Figure 3:
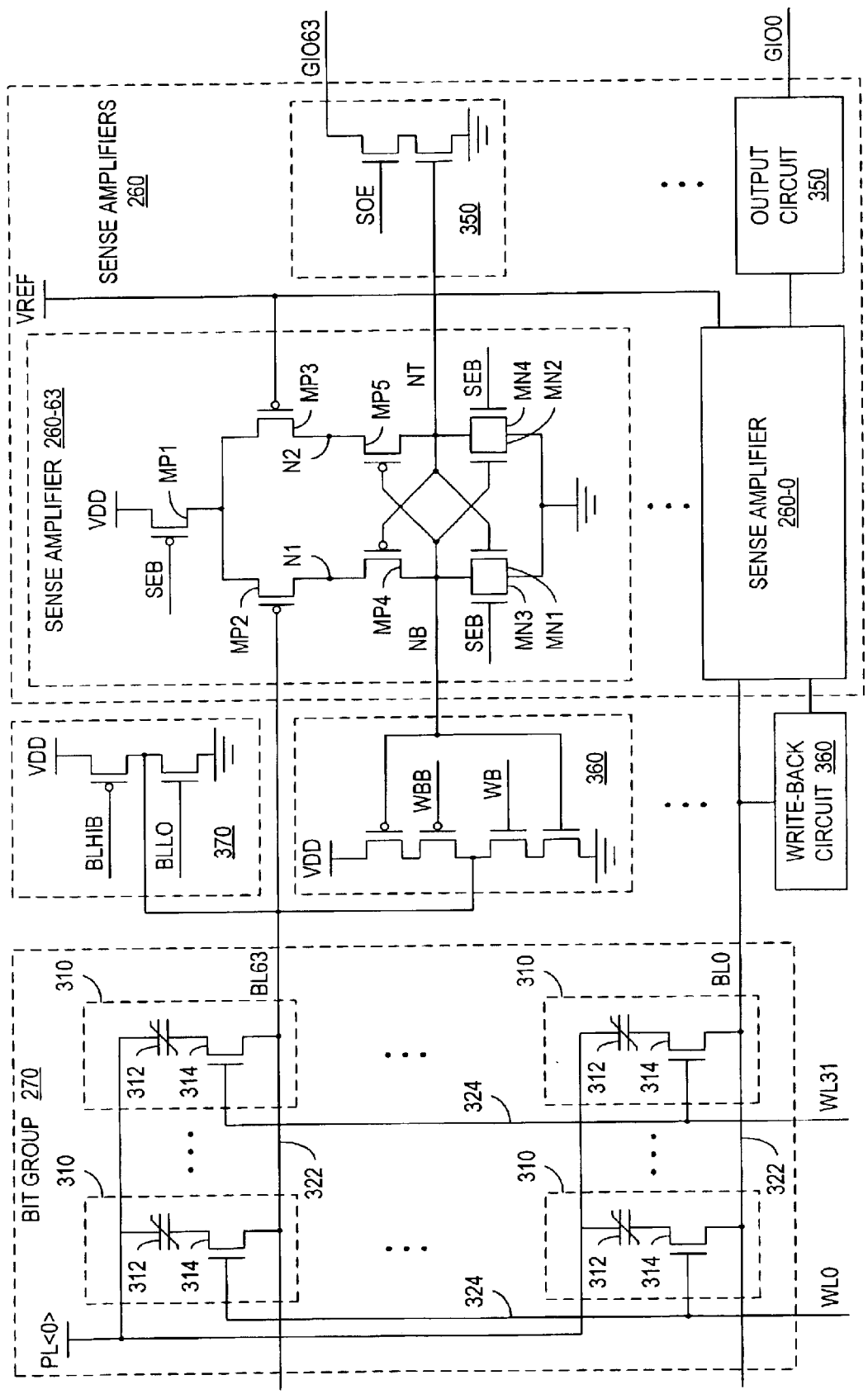
FIG. 3 illustrates a segment within the section of FIG. 2.

FIG. 3 shows an exemplary bit group 270, which has associated bit lines BL0 to BL63 and sense amplifiers 260-0 to 260-63. In the illustrated embodiment, bit group 270 is an array of FeRAM cells 310, where each FeRAM cell 310 contains a ferroelectric capacitor 312 having one plate connected to the plate line for the bit group 270 and a second plate connected through a select transistor 314 to a bit line. Other FeRAM cell and bit group structures such as those including two ferroelectric capacitors connected to complementary bit lines could also be used in alternative embodiments of the invention.

For a normal write operation, signals GIO<63:0> on the global I/O bus indicate data bits to be written. The global I/O bus is connected to the bit lines BL63 to BL0 of the selected segment, and voltage differences between the bit line voltages and the voltage of the activated plate line set the polarization states of FeRAM cells 310 in the selected row of FeRAM cells to represent the data values being written.

For a normal read operation, activation of the plate line of the selected bit line group causes a current through ferroelectric capacitors 312 in the selected FeRAM cells to bit lines BL0 to BL63. The activated plate line forces all ferroelectric capacitors in the selected row into the same polarization state, and the amount of current or charge to each bit line depends on whether the activated plate line flipped the polarization state of the ferroelectric capacitor 312. Sense amplifiers 260 can sense the bit line voltage or current and generate a data value that is output to the global I/O bus.

Bit lines BL0 to BL63 are continuous across all bit groups 270-0 to 270-15 in a segment 240 and are connected to sense amplifiers 260 during read operations. Although illustrated as being on one side of bit group 270 in FIG. 3, half of the sense amplifiers 260 are generally on an opposite end of the bit lines BL0 to BL63 to facilitate layout of sense amplifiers 260 within the pitch of bit lines BL0 to BL63.

In the exemplary embodiment, each of sense amplifiers 260 is a comparator type sense amplifier such as described in U.S. patent application Ser. No. 10/115,753, entitled "FeRAM with a Single Access/Multiple-Comparison Operation." Each sense amplifier 260 operates during a sensing operation to compare the voltage on the attached bit line to a reference voltage VREF from reference voltage generator 265 without changing the bit line voltage. Output drivers 350 drive data signals GIO<63:0> to represent the data values that sense amplifiers determine by the end of the sensing operation, and write back circuits 360 set the bit line voltages as required for write-back operations that restore data values in the selected FeRAM cells 310 after the read operation.

Figure 4:
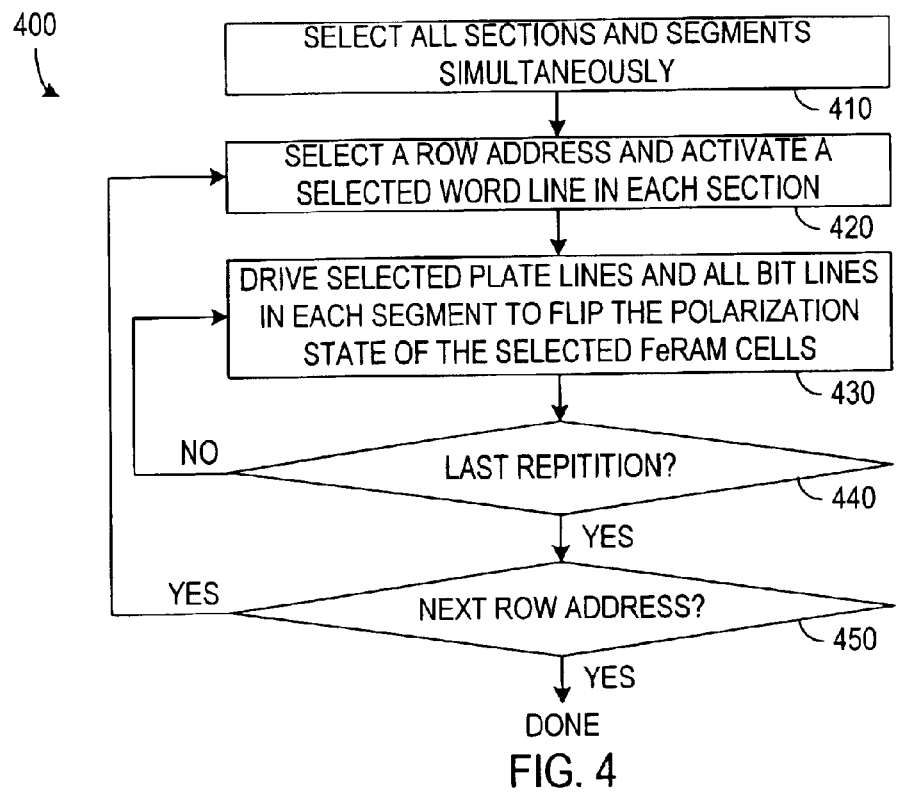
FIG. 4 is a flow diagram of an accelerated fatigue operation in accordance with an embodiment of the invention.

Drive circuits 370 connected to bit lines BL0 to BL63 pull the bit line voltages up or down for accelerated fatigue operations in accordance with the invention. FIG. 4 is a flow diagram of an accelerated fatigue operation 400 in accordance with an embodiment of the invention. Accelerated fatigue operation 400 rapidly cycles FeRAM cells between two polarization states. Fatigue operation 400 is accelerated relative to performing normal read and write operations because fatigue operation 400 simultaneously accesses more FeRAM cells and because fatigue operation 400 can avoid the delays associated with data I/O and sensing times that normal operations require.

Accelerated fatigue operation 400 begins in step 410 by selecting all sections and all segments. In memory 100 of FIG. 1, main control logic 140 activates a signal AF which causes section pair decoder 130 and segment group decoder 135 to operate in a test mode in which all section pair select signals SCPSEL0 to SCPSEL3 and all segment select signals SGSEL0 to SGSEL31 are simultaneously activated to select all sections 120 and segments 240.

In step 420, an address signal selects a row in each section 120 to identify FeRAM cells that are the subject of the accelerated fatigue operation 400. An external source can input the address signal via I/O pads of the FeRAM chip, or internal control circuitry can generate the address signal. For example, in memory 100, main control logic 140 when in a test mode can generate an address signal A<9:0> that selects a row of FeRAM cells in each section 120. Within each section 120, normal address decoding in plate group select logic 220, word line decoder 230, and word line drivers 235 select and activate one of word lines WL0 to WL511.

With a row address for the accelerated fatigue operation selected, step 430 drives a selected plate line and all bit lines to levels that flip the polarizations states of the selected FeRAM cells. For the plate lines in this embodiment of the invention, normal address decoding of the selected row address in plate group select logic 220 activates one of plate line select signals PSEL0 to PSEL15. Since all of the segment select signals SGSEL0 to SGSEL31 are activated, each segment 240 contains a plate drive circuit 225 that responds to the activated plate line select signal by driving a corresponding plate line to a voltage (e.g., Vcc or Vss) that segment control logic 250 selects. Simultaneously with drivers 225 driving the selected plate lines, bit line bias circuits 370 drive all bit lines to a voltage that is complementary to the voltage of the activated plate line.

Step 430, which flips the polarization states of the selected FeRAM cells, applies different voltages to the bit lines and the selected plate lines depending on the current polarization state of the selected FeRAM cells. More specifically, if the selected FeRAM cells are in a first polarization state, main control circuit 140 activates a signal BLHIB and deactivates a signal BLLO, and segment control logic 250 activates a signal PLLO and deactivates a signal PLHIB. In response, bit line bias circuits 370 then drive all bit lines BL0 to BL63 in every segment 240 to supply voltage VDD, while plate drive circuits 225 ground the selected plate line in every segment 240 and force the selected FeRAM cell into a second polarization state. If the selected FeRAM cells are in the second polarization state, main control circuit 140 deactivates signal BLHIB and activates signal BLLO, and segment control logic 250 deactivates signal PLLO and activates signal PLHIB. Bit line bias circuits 370 then ground all bit lines BL0 to BL63 in every segments 240, and plate drive circuits 225 drive each selected plate line to supply voltage VDD.

Step 440 is a decision step that determines whether any further cycle of the selected FeRAM cells is required. If further cycling is necessary, operation 400 branches from step 440 back to step 430 and again flips the polarization state of the selected memory cells. An exemplary accelerated fatigue operation may flip the polarization state of FeRAM cells between $10^{12}$ and $10^{14}$ times. After operation 400 reaches the target number of cycles for a selected set of FeRAM cells, step 450 determines whether any further rows of memory cells require testing. If so, operation 400 branches from step 450 back to step 420 and selects another row address identifying another set of FeRAM cells. When the desired FeRAM cells have all been fatigued, accelerated fatigue operation 400 is done, and other tests can measure the performance of the selected FeRAM cells to detect changes in the FeRAM cells caused by fatigue.

One advantage that accelerated fatigue operation 400 has over prior methods for fatiguing FeRAM cells is that fatigue operation 400 simultaneously accesses and fatigues a larger number of FeRAM than do normal read and write operations. In particular, a normal read or write operation in FeRAM 100 affects one row of FeRAM cells in one segment 240 (64 FeRAM cells), but accelerated fatigue operation simultaneously affects one row in each segment 240 (or about 128×64 FeRAM cells). Additionally, only one row in each segment is accessed, and each segment 240 has independent bias circuits for word lines, bit lines, and plate lines that do not need to be increased in size to provide the necessary current to mimic write and read operations during accelerated fatigue operation 400.

Figure 5:
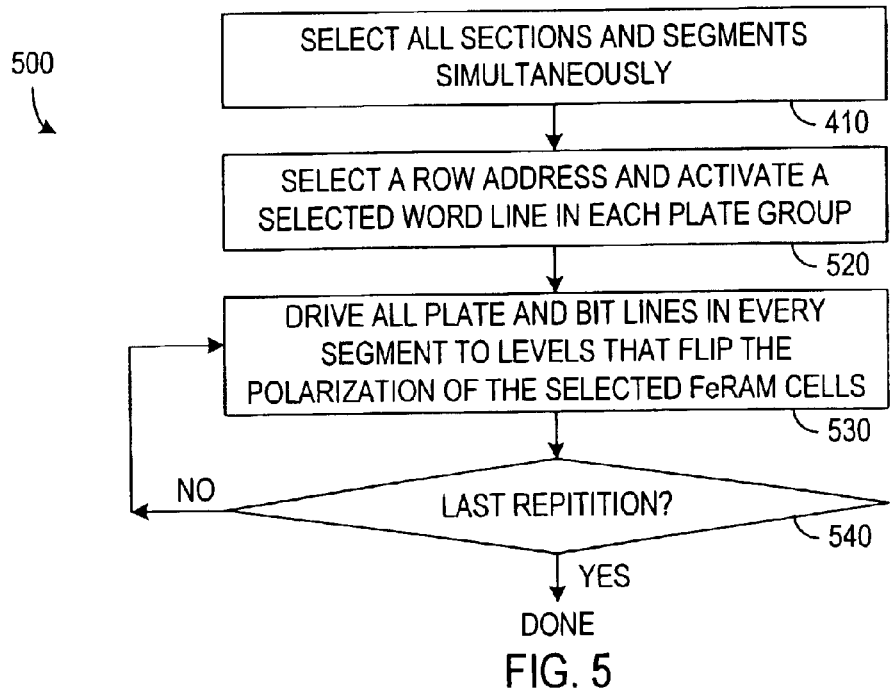
FIG. 5 is a flow diagram of an accelerated fatigue operation in accordance with another embodiment of the invention.

FIG. 5 illustrates a flow diagram of an accelerated fatigue operation 500 that is capable of simultaneously fatiguing a large number of FeRAM cells. Fatigue operation 500 begins in the same manner as fatigue operation 400 (FIG. 4) with step 410, which simultaneously selects or activates all sectors and segments in a FeRAM.

Step 520 of accelerated fatigue operation 500 selects and activates a word line in every plate line group of every segment. In memory 100 of FIG. 1, for example, main control logic 140 activates signals AF and a signal AFPG16 to initiate accelerated fatigue operation 500. Activated signal AF causes section pair decoder 130 and segment decoder 135 to simultaneously activate select signals SCPSEL0 to SCPSEL3 and SGSEL0 to SGSEL31. Activate signal AFPG16 causes plate group select logic 220 (FIG. 2) to simultaneously activate all plate line select signals PLSEL0 to PSEL15. With plate line select signals PLSEL0 to PSEL15 active, each word line decoder 230 selects one word line. As a result, each segment 240 (and each section 120) has 16 simultaneously activated word lines.

With multiple word lines active in each segment, step 530 drives all plate lines and all bit lines to levels that flip the polarizations states of selected FeRAM cells. In memory 100, activation of all plate line select signals causes all plate line drive circuits 225 (FIG. 2) to drive their respective plate lines. Bit line drive circuits 370 simultaneously drive all bit lines to a complementary voltage level that in combination with the plate line voltage flips the polarizations of the selected FeRAM cells. In a manner similar to that described above for step 430, the drive voltages on the bit lines and plate lines depend on the current polarizations state of the selected FeRAM cells.

Accelerated fatigue operation 500 simultaneously accesses a large number of FeRAM cells, but for the most part does not require large driver circuits. In particular, in the embodiment of FIG. 2, each word line drive circuit 235 drives a single word line, and each plate drive circuit 225 drives a single plate. Accordingly, circuits 225 and 235 that have the sizes required for normal write and read access are sufficient for accelerated fatigue operation 500. However, transistors in bit line drive circuits 370 (FIG. 3) must provide sufficient current to simultaneously flip the polarizations states of multiple FeRAM cells and must be sized accordingly. Transistors of circuit 370 should be about one quarter of the size of corresponding transistors in plate line drivers 225. This is because the PL driver drives the capacitive load of 64 FeRAM cells, while transistors in 370 only have to drive 16 FeRAM cells in the exemplary embodiment of accelerated fatigue operation 500.

Figure 6:
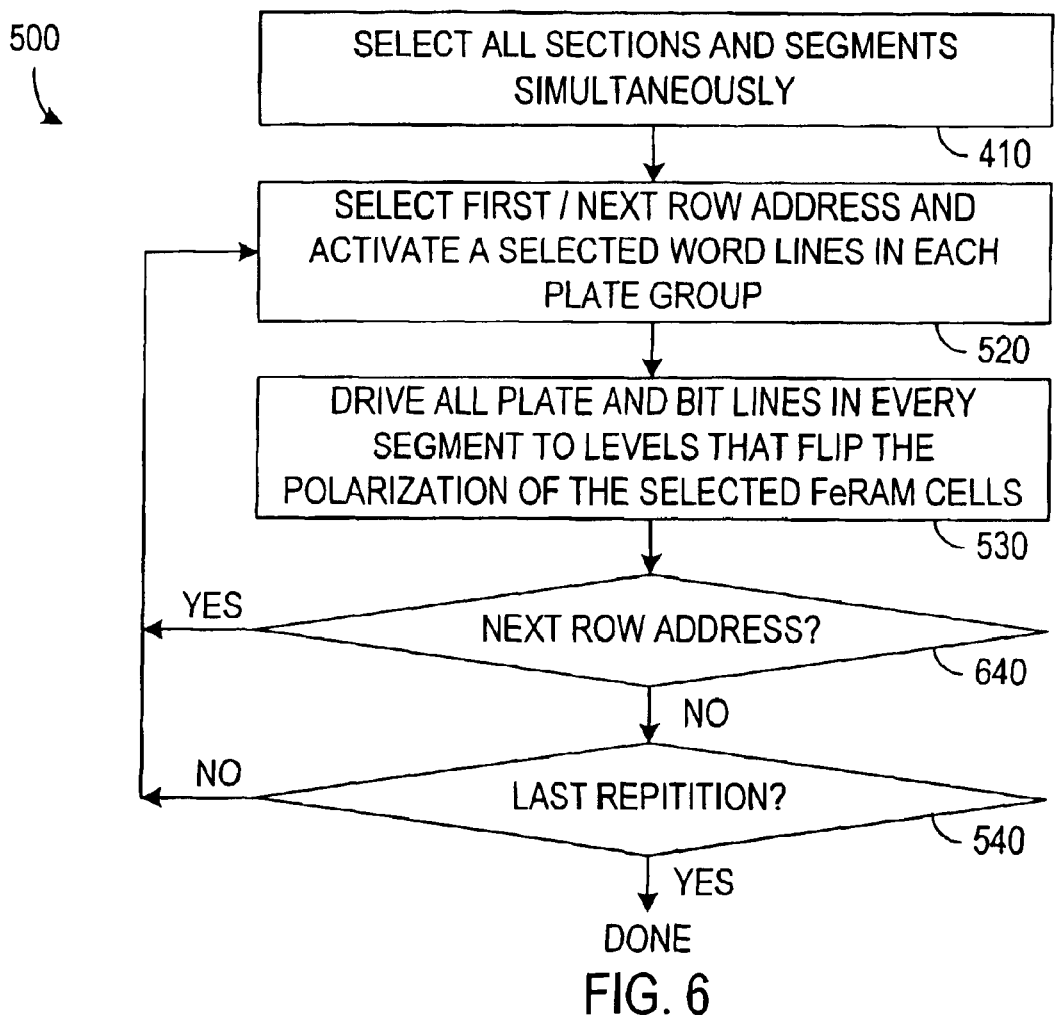
FIG. 6 is a flow diagram of an accelerated fatigue operation in accordance with yet another embodiment of the invention.

Accelerated fatigue operation can be expanded to fatigue every FeRAM cell in a short period of time. In particular, since operation 500 accesses one row of FeRAM per plate line group, every FeRAM cell can be accessed using a set of row addresses that cover one plate line group. FIG. 6 is a flow diagram of a fatigue operation 600 for an entire FeRAM. Fatigue operation 600 includes steps 410, 520, 530, and 540, which are performed in the same manner as in fatigue operation 500. Fatigue operation 600 additionally includes a step 640, which causes cycling of the row address through a set of values (e.g., 0 to 31) that provides complete coverage of the FeRAM. Fatigue operation 600 can thus provide an even fatigue to all FeRAM cells because the cycling through the word line addresses is nested within the number of repetitions of the cycling of the polarization state.

The accelerated fatigue operations described above significantly reduce the time required to test the effects of fatigue on a FeRAM. Generally, to accurately characterize fatigue effects during development of a FeRAM, the memory cells are exercised for as many cycles as time allows under various conditions. If the test indicates that the memory theoretically can be operated more than $10^{16}$ times, a 10-year lifetime can be guaranteed. However, a fatigue operation using conventional write operations with a cycle time of 80 ns requires about 2 days (i.e., $10^{12} \times 80$ ns×2~44.4 hours) of test time to exercise a memory cell $10^{12}$ times and about 6 months (i.e., $10^{14} \times 80$ ns×2~6 months) to exercise a memory cell $10^{14}$ times.

The number of memory cells that can be simultaneously exercised using a conventional write operation generally depends on the data path widths and is often less than 128 memory cells. Accordingly, fatigue testing of a significant portion of an average size memory using normal accesses (e.g., write operations) requires too much time to be practical. Accelerated fatigue operations 400, 500, and 600 in the exemplary embodiment activate 128 segments and exercise a selectable subset of rows within each segment. In the exemplary embodiment, accelerated fatigue operation 400 exercises one row within each segment and allows simultaneous exercise of 8,192 memory cells (i.e., 128 segments×1 row×64) per clock cycle. Accelerated fatigue operations 500 and 600 exercise 16 rows within each segment and allows simultaneous exercise of 131,072 (i.e., 128 segments×16 row×64) memory cells.

The accelerated fatigue operations still need $2 \times 10^{12}$ clock cycles to exercise the memory cells $10^{12}$ times. However, the exercise sequence is much simpler than in a normal write operation. Since the sequence to be written is already known ("01010 . . . "), the accelerated fatigue operations in accordance with the invention do not require data to be brought in from the outside of the array. The accelerated fatigue operation can thus be a closed internal operation, which eliminates much delay. Another advantage of fatigue operations 400 and 500 is that the word-lines do not have to be pulsed and can be held at supply voltage VDD, because the same rows are repeatedly accessed. The clock period for the accelerated fatigue operations may thus be much smaller than the clock period for a normal memory access. A clock period of ions, for example, allows accelerated fatigue operation 400 to exercise 8,192 memory cells $10^{12}$ times in only 5½ hours ($10^{12}\times10$ ns$\times2=5.5$ hours) or $10^{14}$ times in 23 days ($10^{14}\times10$ ns$\times2$). The shorter times makes fatigue testing more practical during development and/or production of FeRAM.

Although the invention has been described with reference to particular embodiments, the description is only an example of the invention's application and should not be taken as a limitation. For example, although the above fatigue operations are described in relation to an exemplary FeRAM architecture and size, the fatigue operations can be employed for sizes and architectures of memory. Various other adaptations and combinations of features of the embodiments disclosed are within the scope of the invention as defined by the following claims.

What is claimed is:

1. An integrated memory comprising:
   a plurality of segments, wherein each segment comprises a plurality of bit lines and an array of memory cells connected to the bit lines of the segment;
   a control circuit that generates an address signal that cycles through a set of values during a closed internal operation; and
   an address decoding circuit having a first mode and a second mode, wherein:
      the address decoding circuit operates in the first mode for read and write operations, and in the first mode, the address decoding circuit selects one of the segments and makes only the memory cells in the selected segment accessible; and
      the address decoding circuit operates in the second mode to select all of the segments so that memory cells in all of the segments are simultaneously accessible for a change in state and during the closed internal operation, decodes the address signal to select at least one row of the memory cells in each of the segments.

2. The memory of claim 1, wherein:
   each of the segments further comprises a plurality of plate lines with each of the plate lines being connected to a subset of the memory cells in the array; and
   each memory cell comprises a select transistor and a storage capacitor, wherein the select transistor connects a first plate of the storage capacitor to a corresponding one of the bit lines, and a second plate of the storage capacitor is connected to a corresponding one of the plate lines.

3. The memory of claim 2, wherein in the second mode, the address decoding circuit activates only one of the plate lines in each segment.

4. The memory of claim 3, wherein the address decoding circuit operates in a third mode to selected all of the segments and activate all of the plate lines in all of the segments.

5. The memory of claim 1, wherein:
   in the first mode, the address decoding circuit makes only the bit lines in the selected segment accessible; and
   in the second mode, the address decoding circuit activates drive circuits for all of the bit lines.

6. The memory of claim 1, wherein the set of values of the address signal when combined with all of the segments being selected by the address decoding circuit operating in the second mode provides complete coverage of the memory cells.

7. The memory of claim 1, wherein:
   each of the segments further comprises a plurality of plate lines with each of the plate lines being connected to a subset of the memory cells in the array; and
   during the closed internal operation, the address decoding circuit decodes the address signal from the control circuit and for each of the plate lines, selects at least one row of the memory cells in the subset of the memory cells connected to the plate line.

8. A FeRAM comprising:
   a memory section comprising memory cells, bit lines, and word lines, the memory cells being arranged in rows and columns with each row of memory cells being connected to a corresponding one of the word lines, each column of memory cells being connected to a corresponding one of the bit lines, wherein the memory section is divided into segments with each segment including the bit lines and the memory cells in a set of the columns, each segment further comprising plate lines and drive circuits, the drive circuits being respectively connected to the plate lines in the segment;
   a first address decoding circuit that generates a plurality of segment select signals, each segment signal corresponding to one of the segments; and
   a second address decoding circuit that generates a plurality of plate line select signals, each plate line select signal corresponding to one of the drive circuits in each segment, wherein each drive circuit activates the connected plate line in response to activation of both the corresponding plate line select signal and the segment select signal corresponding to the segment containing the drive circuit, wherein
   the first address decoding circuit has a normal mode in which the first address decoding circuit activates only one of the segment select signals and a test mode in which the first address decoding circuit simultaneously activates all of the segment select signals.

9. The memory of claim 8, wherein the second address decoding circuit has a normal mode in which the second address decoding circuit activates only one of the plate line select signals and a test mode in which the second address decoding circuit simultaneously activates all of the plate line select signals.

10. The memory of claim 9, wherein the memory has a first operating mode in which the first and second address decoding circuits operate in their respective normal modes, a second operating mode in which the first address decoding circuit operates in its test mode and the second address decoding circuit operates in its normal mode, and a third operation mode in which the first and second address decoding circuits operate in their respective test modes.

11. The memory of claim 8, further comprising a control circuit that generates an address signal during a closed internal operation, wherein the first address decoding circuit operates in the first mode, and the second address decoding circuit decodes the address signal during the closed internal operation.

12. The memory of claim 8, further comprising:
   a plurality of memory sections, each memory section comprising memory cells, bit lines, and word lines, the memory cells being arranged in rows and columns with each row of memory cells being connected to a corresponding one of the word lines, each column of memory cells being connected to a corresponding one of the bit lines, wherein the memory section is divided into segments with each segment including the bit lines and memory cells in a set of the columns, each segment further comprising plate lines and drive circuits, the plate lines being respectively connected to the plate lines in the segment; and a third address decoding circuit that generates a plurality of section select signals, wherein the third address decoding circuit has a normal mode in which the third address decoding circuit activates only one of the section select signals and a test mode in which the third address decoding circuit simultaneously activates all of the section select signals.

13. An accelerated fatigue operation comprising:

(a) generating within a FeRAM an address signal having a first/next value from a set of values;

(b) activating one or more word lines corresponding to the first/next value of the address signal to select FeRAM cells in the FeRAM;

(c) activating one or more plate lines that correspond to the activated word lines;

(d) simultaneously activating at least some bit lines in the FeRAM, wherein activated levels of the plate lines and the bit lines flip polarization states in the selected FeRAM cells; and (e) repeating steps (b) to (d) a number of times sufficient to induce fatigue effects in the selected FeRAM cells.

14. The operation of claim 13, wherein the number of times is $10^{12}$ or more.

15. The operation of claim 13, wherein the activated levels of the plate lines and the bit lines change from each repetition to a next repetition.

16. The operation of claim 13, further comprising repeating step (a) before each repetition of steps (b) to (d), wherein each repetition of step (b) activates a set of the word lines that differ from a set of the word lines activated during an immediately preceding execution of step (b).

17. The operation of claim 13, wherein:

step (b) comprises simultaneously activating a plurality of the word lines in the FeRAM, each of the activated word line corresponding to a different one of the plate lines in the FeRAM; and step (c) comprises simultaneously driving each of the plate lines that corresponds to one of the activated word lines.

18. The operation of claim 17, wherein step (c) comprises simultaneously driving all of the plate lines in the FeRAM.

19. The operation of claim 13, further comprising repeating steps (a) to (e) a sufficient number of times to fatigue all of the FeRAM cells.

* * * * *